United States Patent
Murali et al.

(10) Patent No.: US 10,620,661 B2
(45) Date of Patent: Apr. 14, 2020

(54) FINE-GRAINED CLOCK RESOLUTION USING LOW AND HIGH FREQUENCY CLOCK SOURCES IN A LOW-POWER SYSTEM

(71) Applicant: Redpine Signals, Inc., San Jose, CA (US)

(72) Inventors: Partha Sarathy Murali, San Jose, CA (US); Nagaraja Reddy Anakala, Hyderabad (IN)

(73) Assignee: Redpine Signals, Inc., San Jose, CA (US)

( * ) Notice: Subject to any disclaimer, the term of this patent is extended or adjusted under 35 U.S.C. 154(b) by 0 days.

(21) Appl. No.: 16/222,858

(22) Filed: Dec. 17, 2018

(65) Prior Publication Data
US 2019/0187745 A1    Jun. 20, 2019

Related U.S. Application Data

(60) Provisional application No. 62/599,734, filed on Dec. 17, 2017.

(51) Int. Cl.
| | |
|---|---|
| *G06F 1/08* | (2006.01) |
| *G06F 1/14* | (2006.01) |
| *H03K 3/03* | (2006.01) |
| *H03B 5/32* | (2006.01) |
| *G06F 1/06* | (2006.01) |
| *H03B 5/20* | (2006.01) |
| *H03B 5/02* | (2006.01) |

(52) U.S. Cl.
CPC .................. *G06F 1/14* (2013.01); *G06F 1/06* (2013.01); *G06F 1/08* (2013.01); *H03B 5/20* (2013.01); *H03B 5/32* (2013.01); *H03K 3/0315* (2013.01); *H03B 5/02* (2013.01)

(58) Field of Classification Search
CPC ..... G06F 1/04; G06F 1/08; G06F 1/10; G06F 1/14
USPC .................................. 327/291, 293, 294, 298
See application file for complete search history.

(56) References Cited

U.S. PATENT DOCUMENTS

| | | | | |
|---|---|---|---|---|
| 6,891,401 | B2 * | 5/2005 | Starr ....................... | G06F 1/08 327/18 |
| 7,796,719 | B2 * | 9/2010 | Liu ........................ | G06F 13/385 327/291 |
| 2002/0044000 | A1 * | 4/2002 | Hatanaka ................. | H03L 7/00 327/291 |

(Continued)

*Primary Examiner* — Tomi Skibinski
(74) *Attorney, Agent, or Firm* — File-EE-Patents.com; Jay A. Chesavage

(57) ABSTRACT

A periodic output generator has a first clock source coupled to a first counter and a second clock source with a frequency greater than the first clock source, the second clock source coupled to a second counter, the first clock source operating continuously, the second clock source enabled when the first clock source reaches a count C1. The second clock source generates an output when a count C2 is reached, and the counters are reset and the process repeats. In another example, a timestamp generator has a high speed clock and a real time clock operative on a low speed clock. The timestamp generator receives an external event, turns on the high speed clock generator and counts high speed clock cycles C until the arrival of the next time stamp, and computes an event timestamp as the next timestamp less c/f, less the startup time of the high speed clock.

18 Claims, 4 Drawing Sheets

(56) References Cited

U.S. PATENT DOCUMENTS

2005/0156650 A1* 7/2005 Tang ................... G06F 1/04
327/291
2010/0164583 A1* 7/2010 Chen ............... G01R 31/31725
327/261

* cited by examiner

102

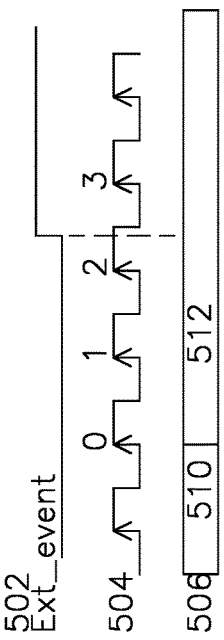
*Figure 3*
Clock Source Characteristics
| | | | | |
|---|---|---|---|---|
| 302 { | 32Khz | RC Osc | 0.4uW | <100ppm with recal 1/sec | 150us startup |
| | 32Khz | XTAL Osc | 0.25uW | <20ppm no recal | 2sec startup |
| 304 { | 32Mhz | RC Osc | 50uW | <100ppm with recal 1/sec | 1us startup |
| | 32Mhz | Ring Osc | 5uW | <1000ppm with recal 1/sec | 1us startup |
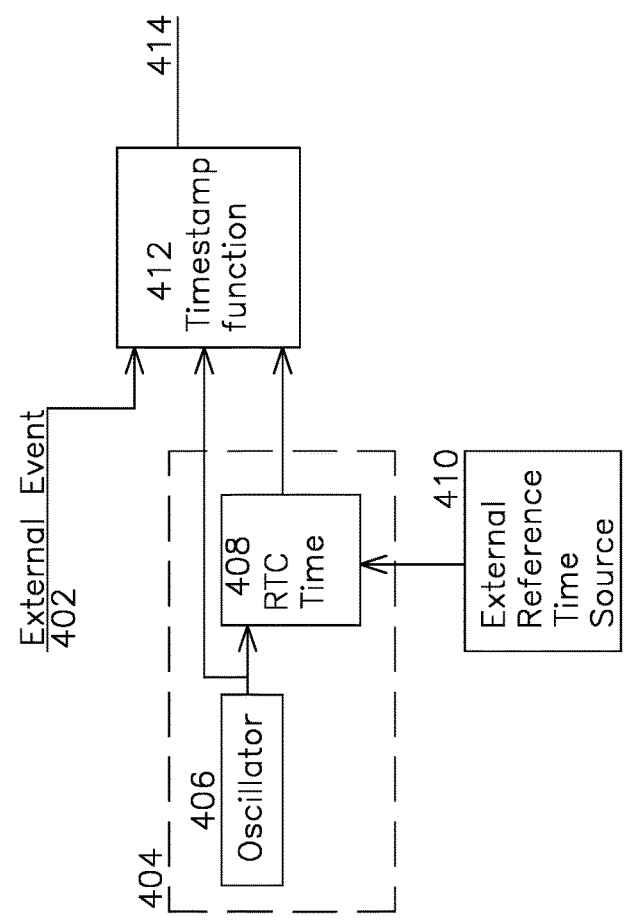
*Figure 4*
Event Timestamping
*Figure 5*

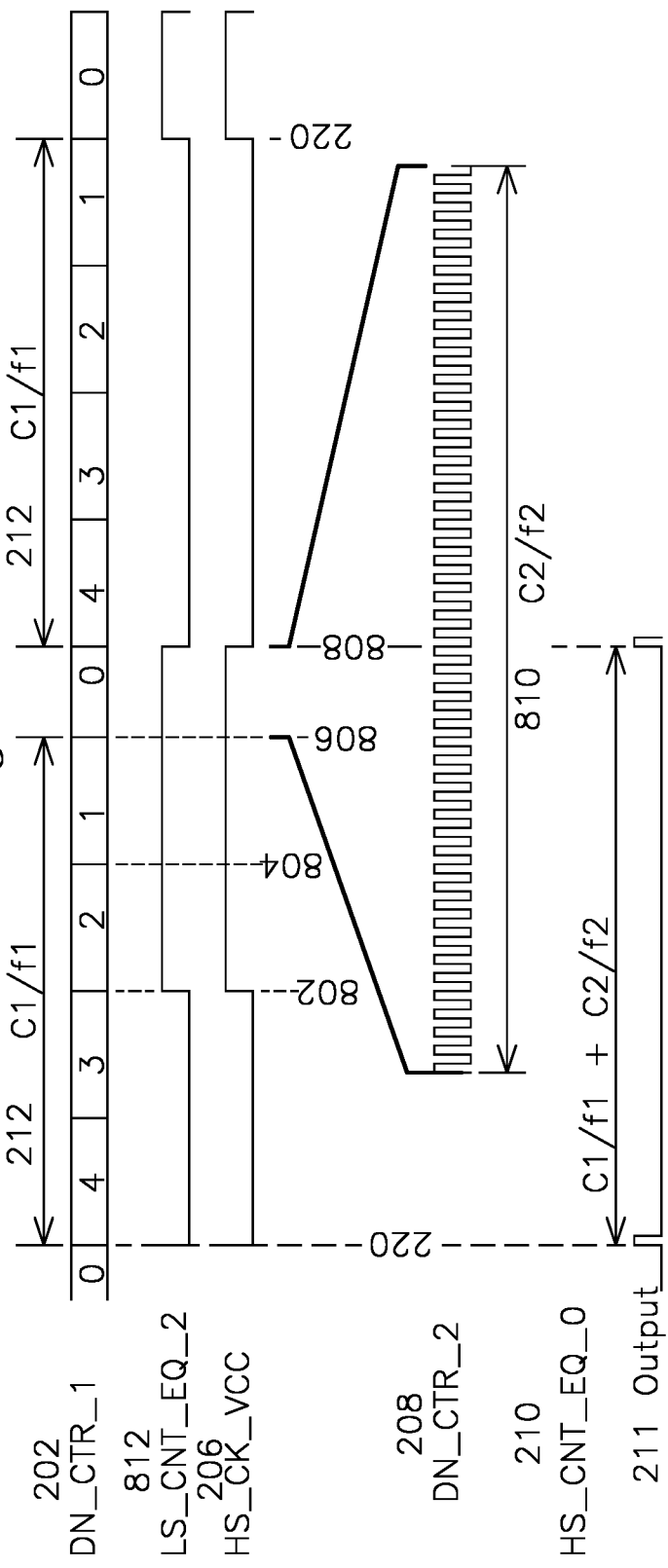

FINE-GRAINED CLOCK RESOLUTION USING LOW AND HIGH FREQUENCY CLOCK SOURCES IN A LOW-POWER SYSTEM

FIELD OF THE INVENTION

The present invention relates to an apparatus and method for precision clocking and timestamping in low power devices. In particular, the invention relates to the use of a high frequency and low frequency clock source for generating and measuring precision time intervals or forming timestamps in a low-power communications system.

BACKGROUND OF THE INVENTION

In low power communications equipment, such as Internet of Things (IoT) devices, a need arises to generate and measure accurate time intervals. The typical approach for this is to use a high precision clock source such as a crystal oscillator, which has very good stability but must be run continuously. In the prior art, the power consumption of an oscillator is related to the frequency of oscillation largely because of the displacement currents generated from charging and discharging dielectrics used in distributing the clock signal. In addition, in low power equipment, it is typical for the clock oscillator to have the lowest frequency which represents a least common multiple of the desired frequencies. For example, if the low power clock source is needed at 8 Khz (a 125 us cycle time), then a multiple of 8 Khz would be used, such as a commonly available 32 Khz oscillator followed by a divide by 4 circuit. This works well for generating frequencies which are 32 KHz/n, such as 32 KHz, 16 KHz, 10.67 KHz, 8 Khz, etc, for n=1, 2, 3, 4, respectively. A difficulty arises when, for example, a 9 Khz source is needed as well as an 8 Khz source, for which the oscillator frequency must be changed to a multiple of the least common multiple of 8 Mhz and 9 Mhz, such as 72 Khz. Phase lock loop methods with non-integer dividers and frequency multipliers may be used to generate frequencies more flexibly, at the expense of increased power consumption.

A related problem is timestamp generation for external events. Greater resolution of the timestamp requires a faster clock frequency which comes at the expense of higher steady state current.

It is desired to provide a clock generation system and a timestamp system which is low power and provides fine-grain control.

OBJECTS OF THE INVENTION

A first object of the invention is a clock generator using a first frequency source with frequency f1 coupled to a first programmable counter for counting c1 clock cycles, the first programmable counter enabling power to a second clock source with frequency f2, the clock generator applying power to the second clock source when c1 clock cycles have occurred, the second high frequency clock source coupled to a counter for counting c2 clock cycles, and when c2 clock cycles have occurred, the clock source asserting an output for one or more high frequency clock cycles and thereafter powering down the second clock source.

A second object of the invention is a timestamp generator having a real time clock and a high speed clock which is powered on upon arrival of an external event, the timestamp of the external event computed by subtracting from a subsequent timestamp a high speed clock interval computed from the sum of the startup delay of the high speed clock Ts and the number of high speed clock cycles divided by the high speed clock frequency.

A third object of the invention is an apparatus and method for frequency correcting a temporally unstable oscillator having a startup time Ts and frequency f, where the temporally unstable oscillator is enabled for a first interval of time T which is longer than Ts during which time the number of clock cycles C1 is counted, followed by a second interval of time equal to the first interval of time where C2 clock cycles are counted, the frequency correction being Cf=C2/(T*f), and Ts being:

$$(C2-C1)/(Cf*f).$$

SUMMARY OF THE INVENTION

A clock generator has a first clock generator and a second clock generator. The first clock generator is preferably a lower frequency than the second clock generator. The first clock generator is coupled to a counter such that after c1 cycles of the first clock, power is enabled to the second clock generator. The second clock generator is coupled to a second counter, such that after c2 clock cycles of the second clock generator, an output is asserted for one or more second clock cycles, after which the first and second counters are reset and the second clock source is powered down and the cycle repeats.

A timestamp generator has an external event input and a periodically updating timestamp. The external event input is coupled to provide power to an oscillator having a startup time Ts and a frequency f, the oscillator coupled to a counter which is reset when the event input is first asserted, the oscillator and counter running from the external event input until the next timestamp update, at which time the counter has a value C of counted oscillator cycles and the counter stops. An external event timestamp is generated by subtracting the time quantity formed by Ts+C/f from the next timestamp update when the counter stopped.

A clock correction factor and oscillator startup time Ts in an oscillator having a frequency f is determined by having the oscillator powered on for a first interval of time T which is longer than Ts. During the first interval, the number of clock cycles C1 is counted, followed by a second interval of time equal to the first interval of time during which C2 clock cycles are counted. The frequency correction Cf is determined from C2/(T*f), and the startup time Ts is computed from (C2−C1)/(Cf*f).

BRIEF DESCRIPTION OF THE DRAWINGS

FIG. 3 shows a table of clock source characteristics.
FIG. 4 shows a block diagram for event timestamping.
FIG. 5 shows a timing diagram for an external event timestamp.
FIG. 8 shows a timing diagram for an auto-calibration embodiment of the invention.

DETAILED DESCRIPTION OF THE INVENTION

Figure 1:
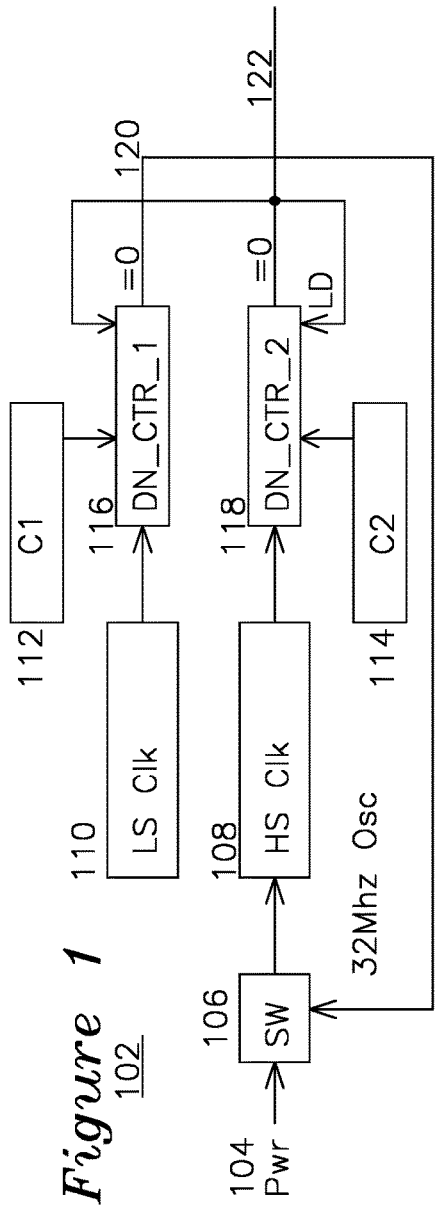
FIG. 1 shows a block diagram of a clock generator.

FIG. 1 shows an example of the clock generator 102 according to the present invention. A first clock source 110 operates at a comparatively lower clock frequency f1 than the second clock source 108 with frequency f2 greater than f1. The first clock source 110 is continuously powered, whereas the second clock source 108 is powered through a switch 106 in response to a power enable signal 120, where power enable signal 120 is generated when first counter 116 has counted a number of cycles equal to C1 112. When the first counter 116 reaches the count C1 112, output 120 is asserted, which applies power to second clock source 108 through switch 106. Second clock source 108 generates a clock signal which is coupled to second counter 118, and after the second clock source 108 has generated C2 cycles, output 122 is asserted, which causes a reset of the first counter 116 and second counter 116. The second clock source 108 has a power up delay Ts before generating its oscillator clock output. The cycle time for the output 122 is therefore C1 cycles at f1 plus C2 cycles at f2 plus the turn-on delay Ts of the second clock source. In practice, the cycle time is programmable with a coarse granularity of C1/f1 and a fine granularity of C2/f2.

The actual implementation of the fine-grained clock generator is not necessarily as shown in FIG. 1, which is intended to serve only as an example embodiment. In the example of FIG. 1, first counter 116 with frequency f1 can be a count-down counter which is initialized with the value C1 at the start of each output generation cycle, and output 120 is asserted when the first counter 116 reaches 0, thereby applying power to and starting second oscillator 108 with frequency f2 which starts a startup delay Ts after application of power, and second counter 118 can similarly be configured to initialize at the start of each output generation cycle to C2, and assert output 122 when second counter 118 counts down to 0. Output 122 thereby has a time interval of C1/f1+Ts+C2/f2.

Figure 2:
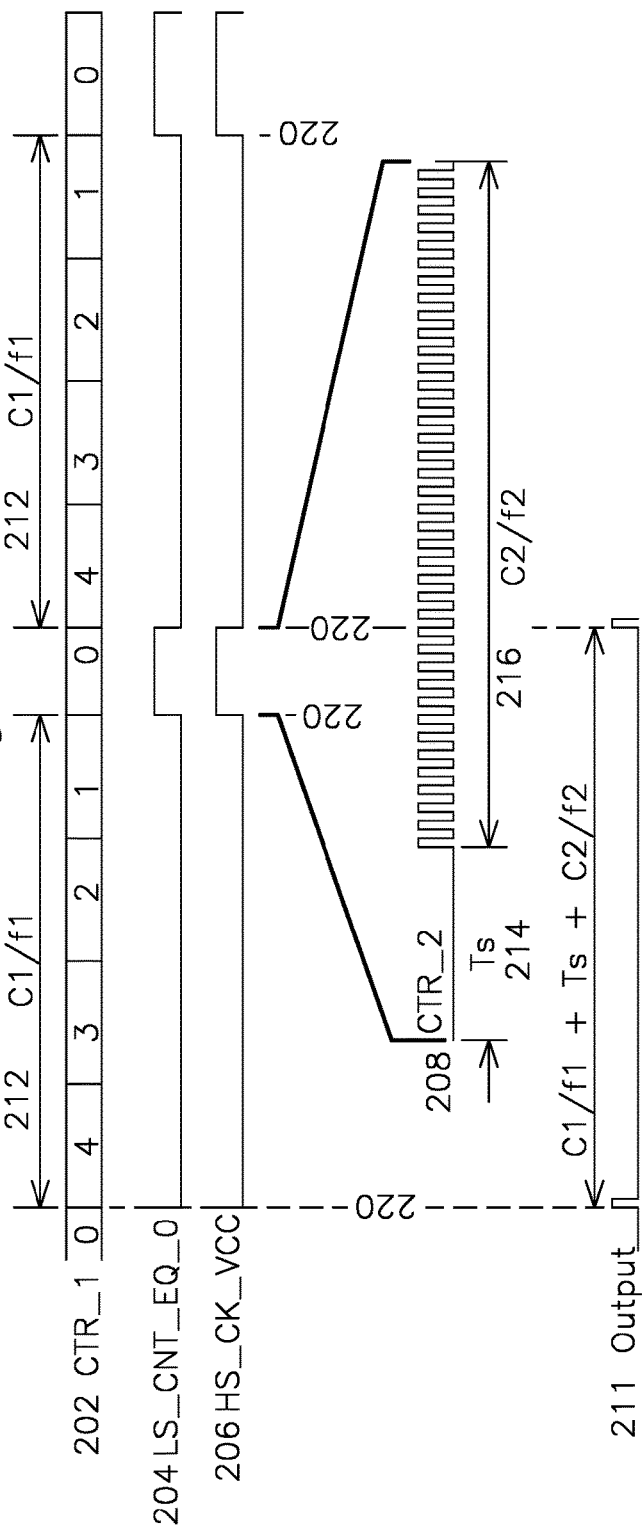
FIG. 2 shows waveform plots for the clock generator of FIG. 1.

FIG. 2 shows example waveforms for the operation of FIG. 1 as described above, with an example output generation cycle starting at time 220 and ending at time 226. Waveform 202 shows the contents of counter 202 for the pre-load and decrement case, and is shown for C1=4, with the first counter 202 counting down to 0, at which time 222 signal 120 is asserted as shown in waveform 204. Waveform 206 shows that no power is provided to second counter 108 until time 222. An expanded view of the time range 222 to 224 is shown in the waveforms below showing that after a startup time Ts 214, the second counter starts counting until it reaches a terminal count C2, at which time output 122 asserts as shown in waveform 210. Accordingly, the cycle time Tc for the output waveform 210 is C1/f1+Ts+C2/f2. For a sufficiently high ratio of f2/f1, fine grained resolution of the cycle time Tc is possible, and because the second clock source 108 is only powered on for a fraction of a first clock source cycle, the power dissipation is minimized while providing fine granularity of resolution for the cyclical output 122.

FIG. 3 shows particular examples of high frequency 304 and low frequency 302 clock sources and characteristics which may be suitable for use in the present invention, without limitation to the particular frequencies and types. As is known in the prior art, crystal (XTAL) oscillators have very high accuracy on the order of 20 parts per million (ppm), as the accuracy is governed by the mechanical properties of the crystal and its vibrational modes, which are well controlled and the crystal can be made to be temperature independent. In many applications, the crystal oscillator is the standard for accuracy, however it has a very long startup time, as it takes time for the mechanical modes of the crystal to stabilize after startup. Resistor/Capacitor (RC) oscillators are well known in the prior art and rely on positive feedback in a feedback loop which contains an RC time constant which determines the operating frequency in combination with a threshold voltage trigger. The accuracy is poor, however with periodic recalibration, the accuracy is acceptable for many uses. Another type of oscillator suitable for high frequency application is a ring oscillator (RO), which is a series of digital inverters which feed in a circular arrangement, usually with an odd number of inverters to ensure positive feedback to preserve oscillation. When powered on, an edge propagates through each inverter (or buffer) with a propagation time tpd, so for n inverters in the ring, the operating frequency is approximately 1/n*tpd. Ring oscillators are known to be very sensitive to variations in temperature and voltage, as tpd is typically a temperature and voltage dependent parameter, whereas the RC oscillator is less prone to temperature and voltage variations. Voltage variations may be controlled by voltage regulators, and temperature variations can be reduced in slope (frequency per unit time) by adding thermal mass and isolation, combined with periodic recalibration close to the interval of use. The recalibration may be performed by forming a correction factor Cf which is multiplied by the oscillator frequency to arrive at a corrected, and more accurate, oscillator frequency.

FIG. 4 shows external event timestamping, where it is desired to place a timestamp on the arrival of external event 402. In one example, a low frequency oscillator 406 is operative with a real time clock (RTC) timestamp 408, which may be periodically updated from an external time source 410 such as GPS, network time, or other precision time source. If the resolution of the RTC timestamp 408 is one second, then additional granularity can be added by using the external event edge to start an oscillator resetting a counter coupled to a comparatively high speed oscillator at the end of each RTC timestamp 408, thereafter counting clock ticks from oscillator 406 until the RTC 408 updates, and subtracting the time corresponding to the clock startup time and clock count from the next update of RTC 408 time. In this manner, the timestamp of any external event may be determined by using the event to start a high speed clock, counting the high speed clock cycles with knowledge of the startup time until a timestamp update from the RTC 408 is presented, and then subtracting the time corresponding to the clock cycles (C/f) and high speed clock startup time Ts from the timestamp update. In a prior art system, the resolution of the RTC is governed by the speed of the oscillator 406, which presents increased power consumption in exchange for improved external event timestamp accuracy. The present system minimizes this by utilizing the high speed oscillator only during the interval between arrival of the external event and the next timestamp update.

FIG. 5 shows a problem of the prior art system which relies only on a low frequency oscillator output 504, where an event 502 which occurs between clock cycles can only be resolved to the following clock cycle when it was detected. For example, the RTC time 506 is shown as incrementing from 510 to 512, and the counter associated with oscillator 504 is reset and starts counting from 0, detecting the external event at time 504=3, where the timestamp accuracy of the detected event is associated with the rate of clock 502.

Figure 6:
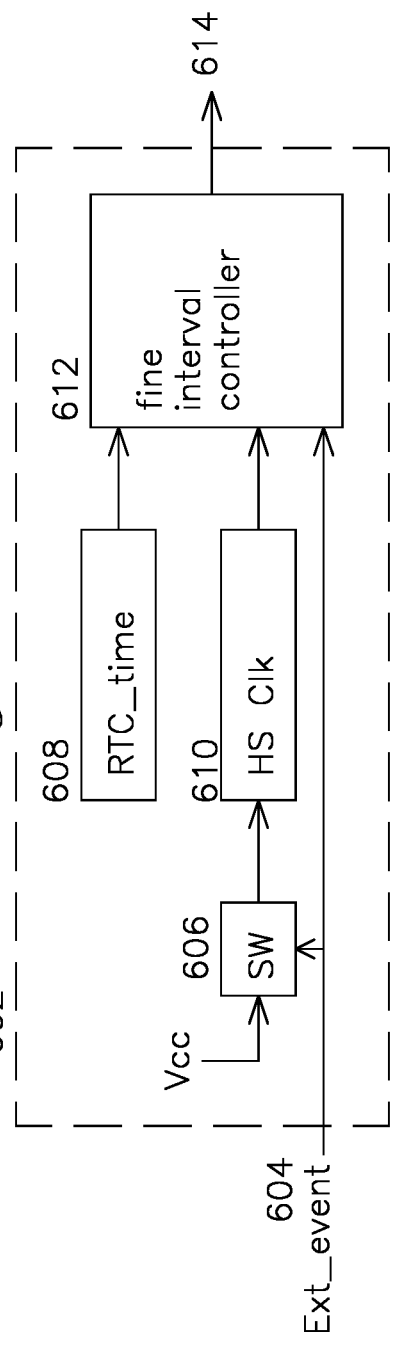
FIG. 6 shows a block diagram for an external event timestamp.

FIG. 6 shown an example of a fine granularity event time stamp apparatus 602. External event 604 is provided to a switch 606 and enables power to high speed (HS) clock 610 when ext_event 604 is asserted. The assertion of external event 604 results in high speed clock 610 turning on and delivering clock counts to the interval controller 612. When the HS clock 610 is powered on by switch 606, there is a delay Ts, after which the HS clock provides clock edges to the fine interval controller, which counts clock increments until the next RTC update.

Figure 7:
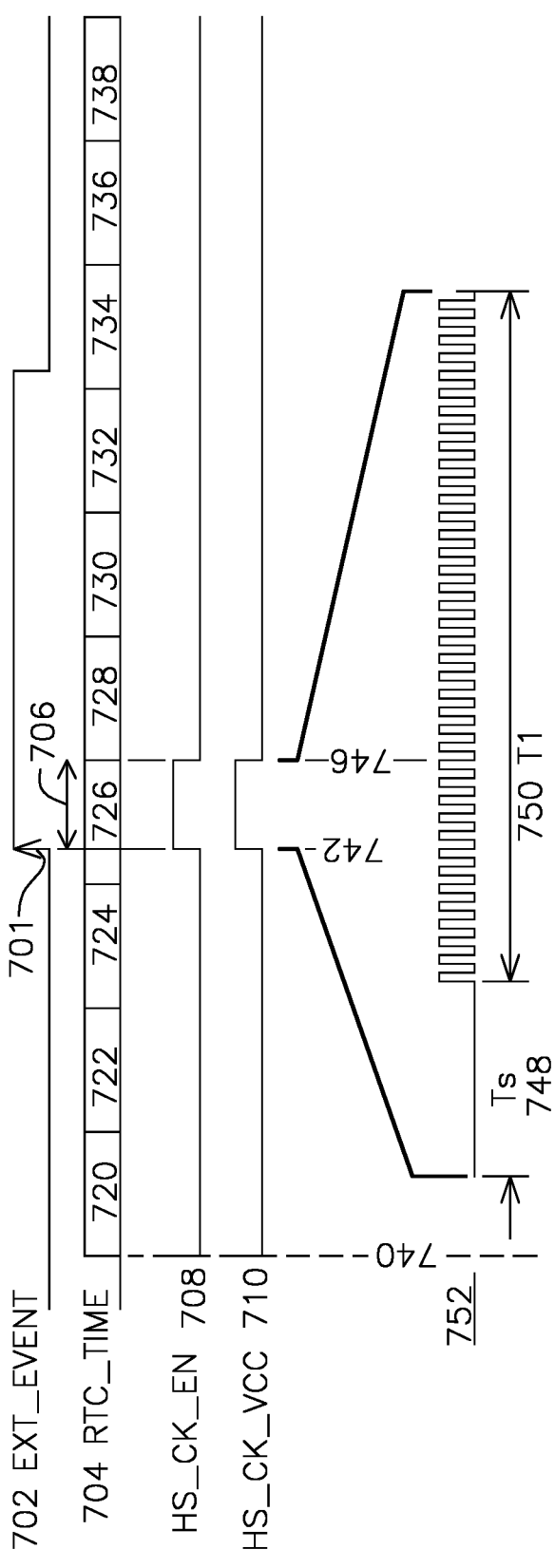
FIG. 7 shows a timing diagram for an external event timestamp.

FIG. 7 shows a timing diagram for the time stamp apparatus 602, where external event 701 shown in waveform 702 occurs at time 742, enabling power to HS clock 610 as shown in waveforms 708 for the enable signal and 710 for the HS clock VCC. The application of power Vcc to the HS clock 610 at time 742 causes the HS clock oscillator 610 to start and run, which is shown in expanded view below of HS clock startup interval Ts 748 and HS clock oscillation interval 750. The fine interval controller 612 is periodically calibrated to maintain the values of Ts and clock period 750, and determines the fine-grain timestamp by subtracting the sum of Ts 748 and T1 750 (computed from the clock period of the HS clock with calibration factors) from the next RTC timestamp update 728. Accordingly, event 701 may be accurately timestamped as occurred at t(728)−Ts 748−T1 750. T1 is the number of clock cycles in 750 divided by f, the high speed clock 610 frequency.

The present invention has many advantages over the prior art, since a high speed clock 610 may be used in combination with a low speed clock which runs continuously for updating RTC timestamp 608, thereby providing both low power consumption and high accuracy.

As low power and accuracy are the dual underlying motivations for the generation of periodic output 211 of FIG. 2 and timestamp measurement of FIG. 6, consideration must be given to the particular oscillators from the table of FIG. 3 for each application. In one example embodiment, the low frequency oscillator is a 32 Khz XTAL oscillator of FIG. 3 drawing only 0.25 uW, and the high frequency oscillator is either a 32 Mhz ring oscillator or RC oscillator, depending on accuracy requirements. These particular frequencies are shown for illustration only in the present examples. Both the ring oscillator and RC oscillator require periodic calibration, which can be performed by counting clock cycles of the high frequency oscillator during a single cycle of the low frequency oscillator. Using the example frequencies shown, a single cycle of the low frequency oscillator should count Ncyc cycles of the high frequency oscillator to be calibrated. Accordingly, a high frequency clock which is at exactly the correct frequency will generate Ncyc=1000 for 32 Mhz over one cycle of 32 Khz. A correction factor of Ncyc/1000 may therefore be applied to any measurement of counted cycles such as 216 of FIG. 2 or 750 of FIG. 7 to arrive at a corrected respective cycle count.

FIG. 8 shows an alternative embodiment of the wakeup timer of FIG. 1 with auto-calibration of the intervals. In this example embodiment for illustration, HS clock 108 is a 32 Mhz ring oscillator and LS clock 110 is a 32 Khz XTAL oscillator with characteristics as described in FIG. 3. The wakeup timer of the alternate embodiment enables the HS oscillator two LS oscillator cycles early, at time 802, corresponding to FIG. 1 where first counter 116 is initialized to C1, as before, and generates an output 120 when the count gets to 2 at time 802 rather than 0 of FIG. 1. The HS oscillator 108 of FIG. 1 is enabled at time 802, and starts up after a delay Ts during the interval 802 to 804, during which time a count Nstartup is measured in one cycle of LS clock 110, followed by the interval from 804 to 806 where a full count Ncyc is measured, from which the correction factor Ncyc/1000 may be generated. In general, the correction factor CF will be Ncyc*(F_LS_CLK/F_HS_CLK) where F_LS_CLK and F_HS_CLK are the nominal clock frequencies for the first clock 110 and second clock 108, respectively. The Ts may additionally be computed as a time from CF*(Ncyc−Nstartup).

The present examples are provided for illustrative purposes only, and are not intended to limit the invention to only the embodiments shown. High speed and high frequency are understood to refer to the same characteristic, and low speed and low frequency are similarly understood to refer to the same characteristic. The use of claims terms such as "order of magnitude" is meant to include the range from 0.1× to 10× the nominal value, whereas "approximately" is understood to include the range of one half to two times the nominal value. The scope of the invention is limited only by the claims which follow.

We claim:

1. A periodic time signal generator comprising:
    a first clock source having a frequency f1 and coupled to a first counter which is initially reset;
    a second clock source having a frequency f2 which is greater than f1 when the second clock source is powered on, the second clock source also having a turn-on delay of Ts, the second clock source output coupled to a second counter which is initially reset;
    the second clock source not enabled until the first clock source reaches a count C1, upon which time power is applied to the second clock source;
    an output pulse generated for one or more second clock source cycles when the second clock source reaches a count C2, after which the second clock source is powered off and the first and second counters are reset;
    whereby the periodic time signal generator has an output interval substantially equal to C1/f1+C2/f2 plus Ts.

2. The periodic time generator of claim 1 where the first counter is initialized on reset to said count C1, said first counter thereafter counting down to 0, at which time said second oscillator is powered on.

3. The periodic time generator of claim 1 where the second counter is initialized on power-up to said count C2, said second counter thereafter counting down to 0, at which time said output is asserted.

4. The periodic time generator of claim 1 where said second counter is powered on by a switch which is enabled when said first counter reaches said count C1.

5. The periodic time generator of claim 1 where said first oscillator is a crystal oscillator.

6. The periodic time generator of claim 1 where said second oscillator is either a ring oscillator or an RC oscillator.

7. The periodic time generator of claim 1 where said first oscillator is used to calibrate said second oscillator.

8. The periodic time generator of claim 1 where said first oscillator is used to determine said Ts of said second oscillator.

9. The periodic time generator of claim 1 where the ratio of f1/f2 is greater than 100.

10. A method for clock generation operative on:
    a first clock source having a frequency f1;
    a second clock source operative to be powered on or powered off, the second clock source having a frequency f2 which is greater than f1 when the second clock source is powered on, the second clock source also having a turn-on delay of Ts;
    a first counter coupled to the first clock source and incrementing on each first clock source cycle;
    a second counter coupled to the second clock source and incrementing on each second clock source cycle;
    the method comprising the canonical sequence:

a first step of powering off the second clock source and resetting the second counter;

a second step of resetting the first clock counter;

upon the first clock counter reaching a count C1, powering on the second clock source;

asserting an output for one or more second clock source cycles when the second clock source reaches a count C2;

returning to the first step.

11. The method of claim 10 where the periodic time signal generator has an output interval substantially equal to C1/f1+C2/f2+Ts.

12. The method of claim 10 where the first counter is initialized on reset to said count C1, the first counter thereafter counting down to 0, at which time the second oscillator is powered on.

13. The method of claim 10 where the second counter is initialized on power-up to said count C2, the second counter thereafter counting down to 0, at which time the output is asserted.

14. The method of claim 10 where the second counter is powered on by a switch when the first counter reaches the count C1.

15. The method of claim 10 where the first oscillator is a crystal oscillator.

16. The method of claim 10 where the second oscillator is a ring oscillator or an RC oscillator.

17. The method of claim 10 where the Ts value is determined by measurement using the first oscillator.

18. The method of claim 10 where the ratio of f1/f2 is greater than 100.

* * * * *